United States Patent
Hunsche et al.

(10) Patent No.: US 10,859,926 B2
(45) Date of Patent: Dec. 8, 2020

(54) METHODS FOR DEFECT VALIDATION

(71) Applicant: ASML NETHERLANDS B.V., Veldhoven (NL)

(72) Inventors: Stefan Hunsche, Santa Clara, CA (US); Rafael Aldana Laso, Mountain View, CA (US); Vivek Kumar Jain, Fremont, CA (US); Marinus Jochemsen, Veldhoven (NL); Xinjian Zhou, Los Altos, CA (US)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 15/580,515

(22) PCT Filed: May 25, 2016

(86) PCT No.: PCT/EP2016/061847
§ 371 (c)(1),
(2) Date: Dec. 7, 2017

(87) PCT Pub. No.: WO2016/202546
PCT Pub. Date: Dec. 22, 2016

(65) Prior Publication Data
US 2018/0173104 A1 Jun. 21, 2018

Related U.S. Application Data

(60) Provisional application No. 62/180,496, filed on Jun. 16, 2015.

(51) Int. Cl.
*G03F 7/20* (2006.01)
*G06T 3/00* (2006.01)
*G06T 7/00* (2017.01)

(52) U.S. Cl.
CPC .......... *G03F 7/7065* (2013.01); *G06T 3/0068* (2013.01); *G06T 7/001* (2013.01); *G06T 2207/30148* (2013.01)

(58) Field of Classification Search
CPC ..... G03F 7/7065; G06T 3/0068; G06T 7/001; G06T 2207/30148
See application file for complete search history.

(56) References Cited

U.S. PATENT DOCUMENTS 6,078,738 A  6/2000  Garza et al.
7,587,704 B2  9/2009  Ye et al.
(Continued)

FOREIGN PATENT DOCUMENTS

WO  2013/179956  12/2013

OTHER PUBLICATIONS

Google Scholar Search Results.*
(Continued)

*Primary Examiner* — Qun Shen
(74) *Attorney, Agent, or Firm* — Pillsbury Winthrop Shaw Pittman LLP

(57) ABSTRACT

A method of defect validation for a device manufacturing process, the method including: obtaining a first image of a pattern processed into an area on a substrate using the device manufacturing process under a first condition; obtaining a metrology image from the area; aligning the metrology image and the first image; and determining from the first image and the metrology image whether the area contains a defect, based on one or more classification criteria.

24 Claims, 10 Drawing Sheets

(56) References Cited

U.S. PATENT DOCUMENTS

| | | | |
|---|---|---|---|
| 2004/0008879 A1 | 1/2004 | Lin | |
| 2007/0219664 A1* | 9/2007 | Yasukawa | G03F 7/70508 700/223 |
| 2008/0163140 A1* | 7/2008 | Fouquet | G03F 1/84 700/110 |
| 2008/0183323 A1 | 7/2008 | Menadeva et al. | |
| 2008/0317329 A1* | 12/2008 | Shibuya | G06T 7/0004 382/149 |
| 2009/0196488 A1* | 8/2009 | Nealey | B82Y 10/00 382/145 |
| 2009/0208090 A1* | 8/2009 | Nishiura | G06K 9/6255 382/149 |
| 2010/0251202 A1 | 9/2010 | Pierrat | |
| 2011/0161893 A1* | 6/2011 | Lin | G03F 1/86 716/52 |
| 2011/0276935 A1 | 11/2011 | Fouquet et al. | |
| 2012/0151428 A1* | 6/2012 | Tanaka | G01B 15/04 716/112 |
| 2013/0146763 A1* | 6/2013 | Kawada | H01J 37/222 250/306 |
| 2013/0271595 A1* | 10/2013 | Hiroi | G01B 15/00 348/80 |
| 2016/0277435 A1* | 9/2016 | Salajegheh | G06F 11/3409 |

OTHER PUBLICATIONS

International Search Report and Written Opinion dated Sep. 29, 2016 in corresponding International Patent Application No. PCT/EP2016/061847.

Hunsche, Stefan et al., "A new paradigm for in-line detection and control of patterning defects", Proc. of SPIE, vol. 9424, pp. 94241B-1-94241B-12 (Mar. 19, 2015).

Korean Office Action issued in corresponding Korean Patent Application No. 10-2018-7001262, dated Jul. 8, 2019.

* cited by examiner

METHODS FOR DEFECT VALIDATION

CROSS-REFERENCE TO RELATED APPLICATIONS

This application is the U.S. national phase entry of PCT patent application no. PCT/EP2016/061847, which was filed on May 25, 2016, which claims the benefit of priority of U.S. patent application No. 62/180,496, which was filed on Jun. 16, 2015, and which is incorporated herein in its entirety by reference.

FIELD

The present disclosure relates to methods for determining the existence of defects on a substrate subject to a device manufacturing process (e.g., IC manufacturing process). The method may be used in connection with a lithographic apparatus or process.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

SUMMARY

Disclosed herein is a computer-implemented method of defect validation for a device manufacturing process, the method comprising: obtaining a first image of a pattern processed into an area on a substrate using the device manufacturing process under a first condition; obtaining a metrology image from the area; aligning the metrology image and the first image; and determining from the first image and the metrology image whether the area contains a defect, based on one or more classification criteria.

According to an embodiment, the area is one that may contain a defect.

According to an embodiment, the method further comprise, if the area contains a defect, reworking or discarding the substrate.

According to an embodiment, the method further comprise obtaining a second image of the pattern processed into the area using the device manufacturing process under a second condition, and determining the one or more classification criteria at least from the first and second images.

According to an embodiment, the first and second images are selected from a group of resist image, image formed by etching, image formed by deposition and a combination thereof.

According to an embodiment, the first image or the second image contains one or more contours.

According to an embodiment, the pattern processed under the first condition is not a defect and the pattern processed under the second condition is a defect.

According to an embodiment, at least one of the first image and the second image is simulated.

According to an embodiment, the one or more classification criteria comprise whether a difference between two images is greater than a difference between the first image and the second image.

According to an embodiment, the one or more classification criteria comprise whether a classifier classifies two images into different categories.

According to an embodiment, obtaining the metrology image comprises obtaining the metrology image by a scanning electron microscope or an optical imaging tool.

According to an embodiment, aligning the metrology image and the first image comprises matching a contour in the metrology image and a contour in the first image.

According to an embodiment, obtaining the first image or the second image comprises using one or more models selected from a group consisting of a source model, a projection optics model, a design layout model, a resist model, an etching model, a deposition model and a combination thereof.

According to an embodiment, identifying the area that may contain a defect comprises: determining a condition under which a pattern is or will be processed into the area; obtaining a process window of the pattern; if the condition falls outside the process window, the area is identified as an area that may have a defect.

According to an embodiment, identifying the area that may contain a defect comprises: simulating an image of a pattern processed or will be processed into the area; measuring one or more parameters of the image; identifying whether the area may have a defect based on the one or more parameters.

According to an embodiment, the one or more classification criteria comprise whether a difference between contours in two images is greater than a difference between contours in the first image and the second image.

According to an embodiment, the device manufacturing process involves using a lithography apparatus.

According to an embodiment, the method further comprise, if the area contains a defect, verifying the defect.

According to an embodiment, the method further comprise, if the defect is not verified, adjusting identification of areas that may contain a defect.

Disclosed herein is a computer-implemented method of defect validation for a device manufacturing process, the method comprising: obtaining a first image of a pattern processed using a device manufacturing process under a first condition; obtaining a second image of the pattern processed using the device manufacturing process under a second condition, different from the first condition; determine one or more classification criteria at least from the first image and the second image; obtaining a metrology image from an area on a substrate, the metrology image containing the pattern; determining from the first image and the metrology image whether the area contains a defect, based on the one or more classification criteria.

According to an embodiment, the first image is a previously obtained metrology image.

According to an embodiment, the second image is a previously obtained metrology image.

According to an embodiment, the first and second images are from different locations on the substrate.

Disclosed herein is a computer program product comprising a computer readable medium having instructions recorded thereon, the instructions when executed by a computer implementing the method of any of methods above.

BRIEF DESCRIPTION OF THE DRAWINGS

Embodiments will now be described, by way of example only, with reference to the accompanying schematic drawings in which corresponding reference symbols indicate corresponding parts, and in which.

DETAILED DESCRIPTION

Figure 1:
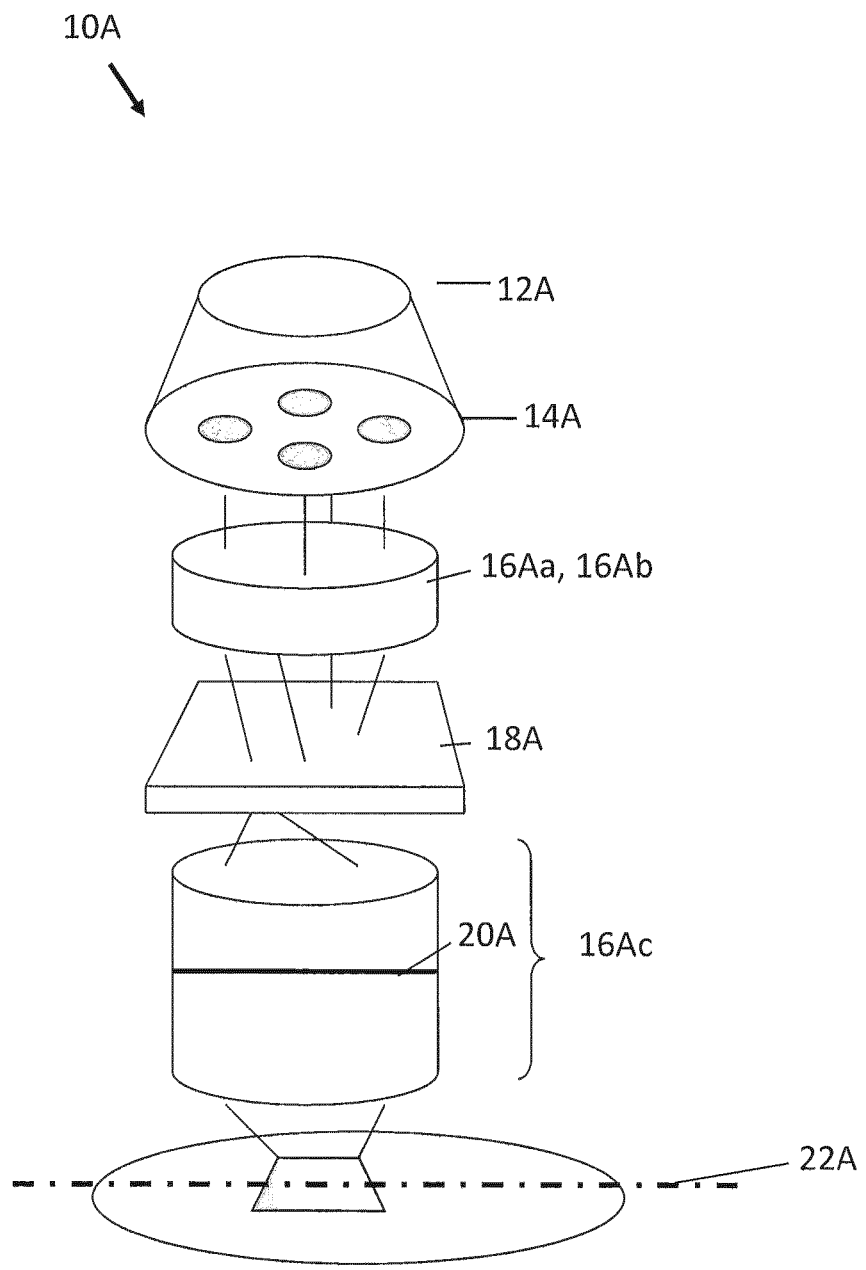
FIG. 1 depicts a lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus. The apparatus comprises:

an illumination system (illuminator) IL to condition a beam PB of radiation (e.g. UV radiation or DUV radiation).

a support structure MT to support a patterning device (e.g. a mask) MA and connected to first positioning device PM to accurately position the patterning device with respect to item PL;

a substrate table (e.g. a wafer table) WT for holding a substrate (e.g. a resist coated wafer) W and connected to second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AM configured to adjust the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The projection system PL has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PL as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PL will have a different Zernike expansion for each field point (i.e. for each spatial location in its image plane). The relative phase of the projection system PL in its pupil plane may be determined by projecting radiation, for example from a point-like source in an object plane of the projection system PL (i.e. the plane of the patterning device MA), through the projection system PL and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PL. The interference pattern is related to the derivative of the phase of the radiation with respect to a coordinate in the pupil plane in the shearing direction. The detector may comprise an array of sensing elements such as, for example, charge coupled devices (CCDs).

The diffraction grating may be sequentially scanned in two perpendicular directions, which may coincide with axes of a co-ordinate system of the projection system PL (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The projection system PL of a state of the art lithographic apparatus LA may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PL in its pupil plane may be determined by projecting radiation, for example from a point-like source in an object plane of the projection system PL (i.e. the plane of the patterning device MA), through the projection system PL and measuring the intensity of radiation in a plane that is conjugate to a pupil plane of the projection system PL, using a detector. The same detector as is used to measure the wavefront to determine aberrations may be used. The projection system PL may comprise a plurality of optical (e.g., lens) elements and may further comprise an adjustment mechanism PA configured to adjust one or more of the optical elements so as to correct for aberrations (phase variations across the pupil plane throughout the field). To achieve this, the adjustment mechanism PA may be operable to manipulate one or more optical (e.g., lens) elements within the projection system PL in one or more different ways. The projection system may have a co-ordinate system wherein its optical axis extends in the z direction. The adjustment mechanism PA may be operable to do any combination of the following: displace one or more optical elements; tilt one or more optical elements; and/or deform one or more optical elements. Displacement of optical elements may be in any direction (x, y, z or a combination thereof). Tilting of optical elements is typically out of a plane perpendicular to the optical axis, by rotating about axes in the x or y directions although a rotation about the z axis may be used for non-rotationally symmetric aspherical optical elements. Deformation of optical elements may include both low frequency shapes (e.g. astigmatic) and high frequency shapes (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PL to correct for apodizations (transmission variation across the pupil plane). The transmission map of a projection system PL may be used when designing a patterning device (e.g., mask) MA for the lithographic apparatus LA. Using a computational lithography technique, the patterning device MA may be designed to at least partially correct for apodizations.

The lithographic apparatus as depicted in FIG. 1 may be used in a device manufacturing process, in which various patterns may be processed onto a substrate. For example, the lithographic apparatus can image various patterns of a design layout represented on a patterning device onto a layer of resist on the substrate. This imaging process may be called a lithographic process. A device manufacturing process may include other steps such as etching and deposition. A device manufacturing process may have many parameters, which may be tuneable or not tuneable. These parameters may be referred to as processing parameters. The processing parameters may lead to defects in a product of the device manufacturing process. For example, a defect may be a pattern processed onto a substrate but the processed pattern is not within its specification. Examples of defects include necking, line pull back, line thinning, CD, edge placement, overlapping, resist top loss, resist undercut and bridging. The concept of defect is closely linked to the concept of process window. A process window of a pattern is a space of the values of the processing parameters—where, if the values of the processing parameters under which the pattern will be processed are within the process window, the pattern so processed will be within specifications.

Different patterns may have different process windows. The process window of the patterns to be processed onto an area of the substrate may be obtained by merging (e.g., overlapping) process windows of each individual pattern within that area. The boundary of the process window of all the patterns contains boundaries of process windows of some of the individual patterns. In another word, these individual patterns limit the process window of all the patterns. These patterns can be referred to as "hot spots" or "process window limiting patterns (PWLPs)," which are used interchangeably herein. When controlling a device manufacturing process, it is possible and economical to focus on the PWLPs. When the PWLPs are not defective, it is most likely that all the patterns are not defective.

Processing parameters may vary with position on a substrate and with time (e.g., between substrates, between dies). Such variation may be caused by change in the environment such as temperature and humidity. Other causes of such variations may include drift in one or more components in the processing apparatus such as the source, projection optics, substrate table, height variations of substrate surfaces, etc. in a lithography apparatus. The actual values of the processing parameters, under which a pattern is processed onto the substrate, may be useful for predicting whether the pattern is a defect or the probability thereof.

An indication which pattern or which area on a substrate is subject to inspection may be made at least partially based on whether or the probability that the pattern is defect or that the area contains a defect.

Inspection of a substrate may include some kind of measurement on the substrate. For example, inspection may include an optical measurement such as diffraction; inspection may include imaging using an optical or electron microscope (e.g., SEM). Determining whether a defect actually exists in an area on the substrate using data from inspection, which is called "defect validation" or simply "validation," may not be straightforward. One approach for validation compares the inspection data (e.g., an SEM image) to the pattern of the design layout but not to the pattern processed onto the substrate. This approach for defect validation is limited by the quality of the inspection data—if the inspection data cannot resolve the defect, the defect cannot be validated. For example, if the inspection data are from an SEM image and the SEM image resolution is too poor to reflect the defect, merely inspecting the SEM image will not determine whether the defect actually exists or not. Using inspection data for defect validation often requires human review of the inspection data, which is subjective and the human review capacity cannot be easily scaled up. Another approach for validation compares the inspection data obtained from one area or one pattern to the inspection data obtained from another. This approach is also limited by the quality of the inspection data. Artifact, noise, and misalignment may also hinder reliable defect validation using this approach.

Figure 2:
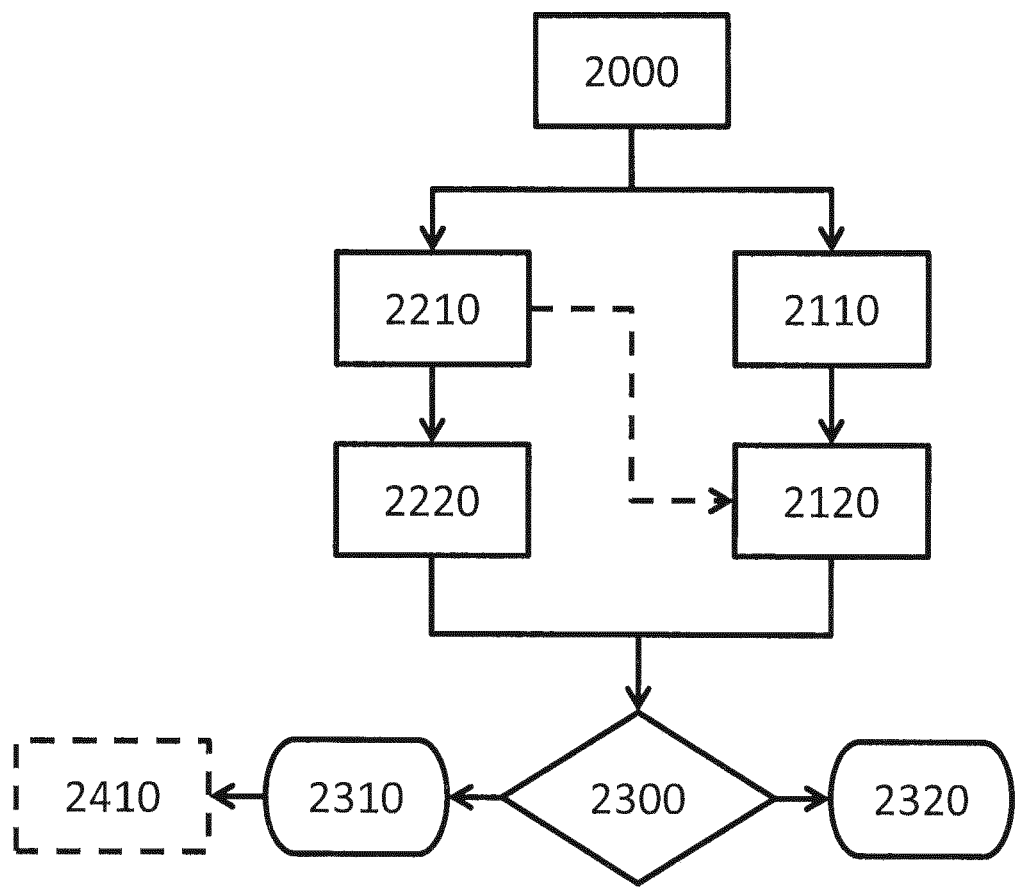
FIG. 2 schematically shows a flow chart for a method of defect validation, according to an embodiment.

FIG. 2 schematically shows a flow chart for a method of defect validation, according to an embodiment. In step 2000, an area on a substrate is identified where the area may contain a defect. In step 2210, a first image of a pattern processed into the area under a first condition and a second image of the pattern processed into the area under a second condition are obtained. The term "condition" may mean a set of values of the processing parameters. The first and second images may be resist images, images formed in the substrate by etching, images formed on the substrate by deposition, etc. The images may include one or more contours of the pattern. The first condition and second condition may include a "good" condition (i.e., a condition under which the pattern is not a defect) and a "bad" condition (i.e., a condition under which the pattern is a defect). For example, the first condition may be a "good" condition and the second condition may be a "bad" condition. The first and second conditions may be both "good" but different conditions (e.g., on is at the center of a process window and the other away from the center of the process window). The images may be simulated using a suitable simulation method. Simulated images may better resemble the actual pattern processed into the area than the shape of the pattern in the design layout because the simulation may take into account impact to the images from the device manufacturing process (e.g., etching, lithography, etc.). Simulated images may not have noise or image shift of images obtained from physical samples. In step 2220, one or more classification criteria are determined at least from the first and second images. The one or more classification criteria may include whether a difference between two images is greater than the difference between the first and second images. The one or more classification criteria may include whether a classifier classifies two images into different categories. The term "classifier" refers to the mathematical function, implemented by a classification algorithm that maps input data to a category. Step 2220 may carried out on an image obtained under a "good" condition and multiple images obtained under "bad" conditions. Step 2220 may carried out on two images under two "good" conditions. In step 2110, a metrology image is obtained from the area. The metrology image may be obtained using a suitable metrology tool. For example, the metrology image may be obtained using a scanning electron microscope (SEM) or an optical imaging tool. In step 2120, the metrology image obtained in step 2110 is aligned to the first (or the second, or both) image obtained (e.g., simulated) in step 2210. For example, the alignment may be done by recognizing a contour in the metrology image obtained in step 2110 and a contour in the first (or the second) image, and matching these contours. In step 2300, it is determined from the first (or the second) image and the metrology image obtained in step 2110 whether the area contains a defect, based on the one or more classification criteria determined in step 2220. If the one or more classification criteria are met, the method reaches determination 2310 that the area contains a defect; if the one or more classification criteria are not met, the method reaches determination 2320 that the area does not contain a defect. For example, when the one or more classification criteria determined in step 2220 are whether a difference between two images is greater than the difference between the first and second images, if the difference between the metrology image obtained in step 2110 and the first (or the second) image is greater than the difference between the first and second images, the method ends with determination 2310 that the area contains a defect. If the method reaches determination 2310 that the area contains a defect, the substrate may be reworked or discarded. If the method reaches determination 2130, in optional step 2410, verify whether the area actually has a defect. If the area does not actually have a defect, the method (e.g., the method shown in FIG. 4) used in step 2000 to identify areas potentially having a defect may be adjusted. For example, if the method used in step 2000 identify areas potentially having a defect by comparing the condition under which the area is processed and the process window of the area, the process window may be adjusted. Step 2300 may be automated (i.e., carried out without human intervention). Step 2310 may also measure the deviation of the metrology image from the first (or second, or both) image and if the deviation is greater than a threshold, the metrology image may be discarded or the metrology tool may be inspected for malfunction. The method represented by the flow chart in FIG. 2 may be less susceptible to noise in metrology data and may be more accurate.

Figure 3:
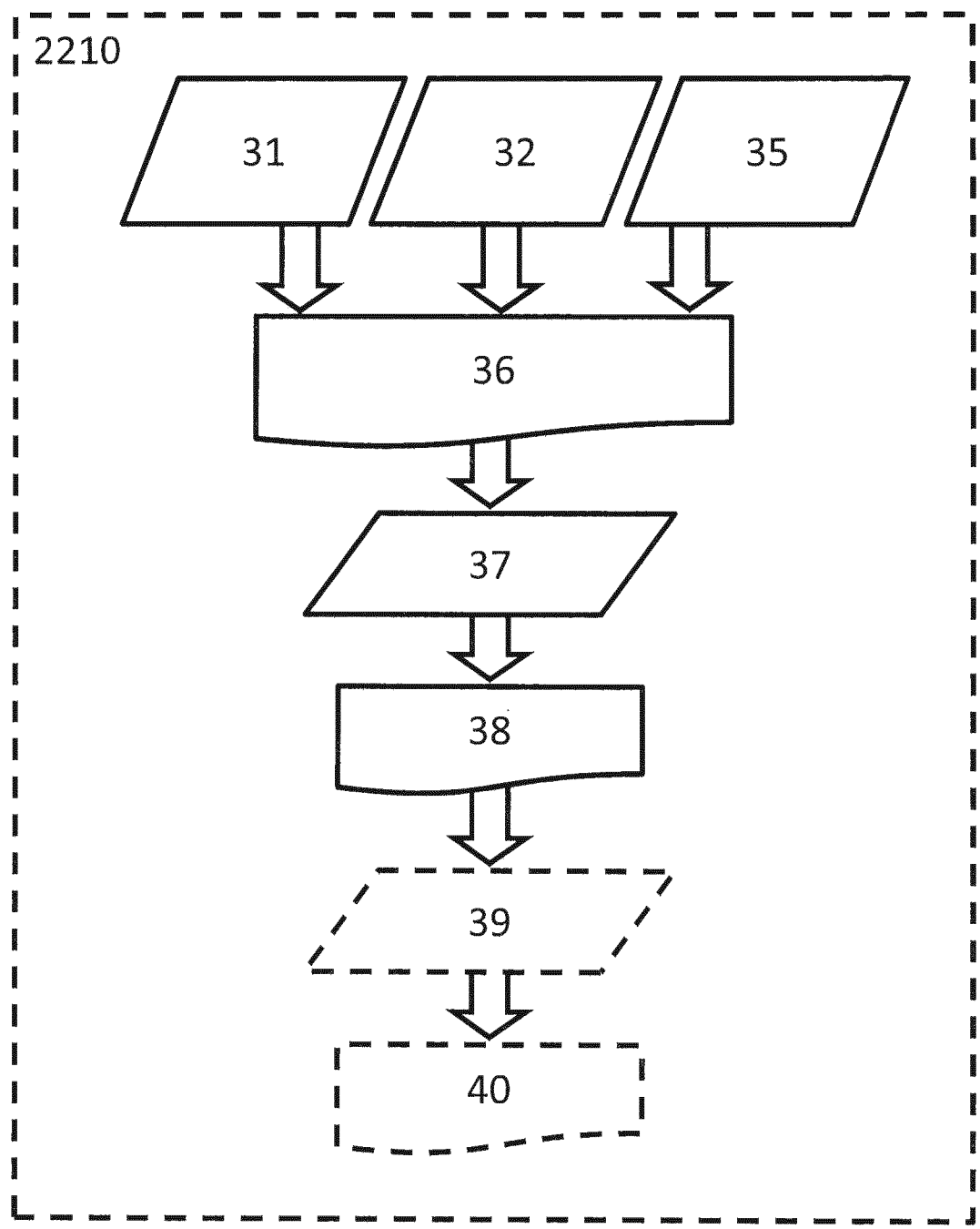
FIG. 3 schematically shows a flow for simulating the images in step 2210 of FIG. 2.

The first image or the second image may be simulated in step 2210 using an exemplary flow represented in FIG. 3. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Optionally, an etching or deposition image 40 may be simulated from the resist image 38 using an etching or deposition model 39.

More specifically, it is noted that the source model 31 can represent the optical characteristics of the source that include, but not limited to, NA-sigma (σ) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587,704, which is incorporated by reference in its entirety.

Figure 4:
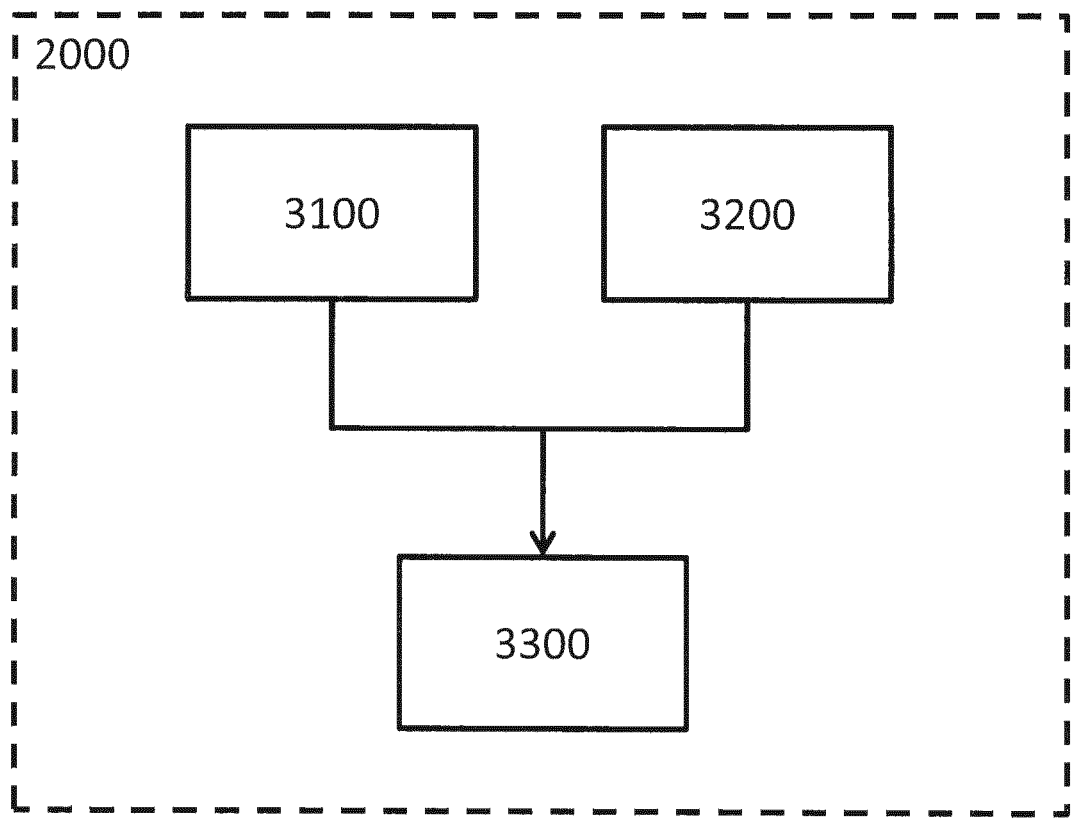
FIG. 4 schematically shows a flow chart for a method for identifying an area that may contain a defect.

The area that may contain a defect may be obtained or identified in step 2000 using any suitable method. FIG. 4 schematically shows a flow chart for one such method, which identifies the area by determining whether or the probability that patterns processed into the area are defects by the device manufacturing process may include the following steps. In step 3200, the condition (i.e., values of the processing parameters) under which the patterns are or will be actually processed (e.g., imaged or etched onto a substrate) is determined. The processing parameters may be local—dependent on the locations of the pattern, the die, or both. The processing parameters may be global—independent of the locations of the pattern and the die. One exemplary way to determine the condition is to determine the status of the lithographic apparatus. For example, laser bandwidth, focus, dose, source parameters, projection optics parameters, and the spatial or temporal variations of these parameters, may be measured from the lithographic apparatus. Another exemplary way is to infer the condition from data obtained from metrology performed on the substrate, or from operator of the processing apparatus. For example, metrology may include inspecting a substrate using a diffractive tool (e.g., ASML YieldStar), an electron microscope, or other suitable inspection tools. The condition may be determined before, and preferably immediately before processing the patterns. In step 3100, the process window (e.g., overlapping process window (OPW)) of the patterns is determined. In step 3300, whether or the probability that the patterns are defects is determined using the condition under which the patterns are or will be actually processed. This determination may be simply comparing the condition and the process window of the area—if the condition falls within the process window, the area is not identified as an area that may have a defect; if the processing parameters fall outside (or are near the boundary of) the process window, the area is identified as an area that may have a defect. This determination may also be done using a suitable empirical model (including a statistical model). For example, a classification model may be used to provide a probability of existence of a defect. Another way to make this determination is to use a computational model to simulate an image of the patterns, measure parameters of the image, and identify whether the area may have a defect based on the parameters. In an embodiment, the processing parameters may be determined immediately (i.e., before processing the pattern or the next substrate) after processing a pattern or a substrate. The determined existence and/or characteristics of a defect may serve as a basis for a decision of disposition: rework or acceptance. In an embodiment, the processing parameters may be used to calculate moving averages of the lithographic parameters. Moving averages are useful to capture long term drifts of the lithographic parameters, without distraction by short term fluctuations.

Figure 5:
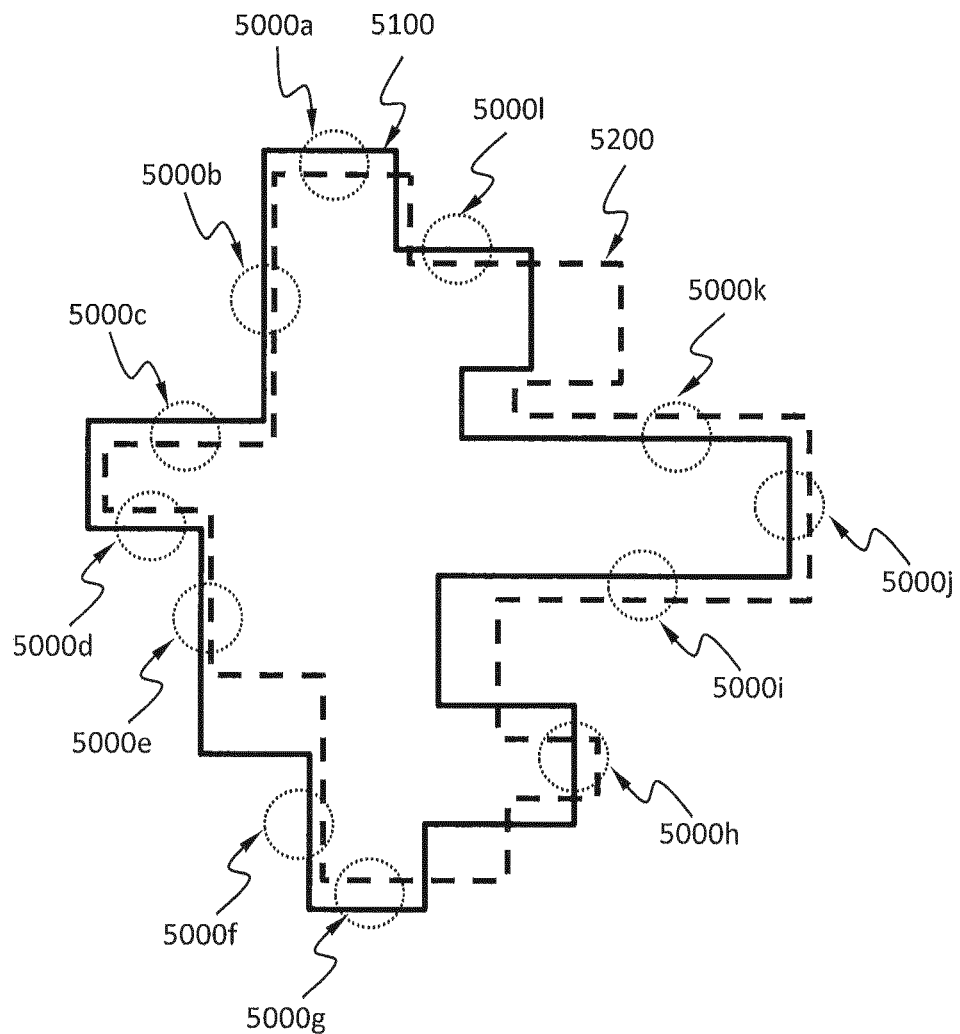
FIG. 5 schematically shows two exemplary contours from the images in step 2210 of FIG. 2.

The one or more classification criteria determined in step 2220 may be any suitable criteria. For example, a contour of the first image may be compared to a contour of the second image and the difference between the first and second images may be represented by the difference between the contours. FIG. 5 schematically shows two exemplary contours 5100 and 5200 from the first and second images, respectively. For example, the sum of squares of the distances at various locations (e.g., locations 5000a-5000l) may be used to represent the difference between the first and second images. Alternatively, parameters of the contours may be used as in a training set for a classifier. Other possible criteria may be determined from parameters extracted from the images such as CDs, EPEs, contour area, normalized contour area, acceptable contour bounds, etc.

Figure 6:
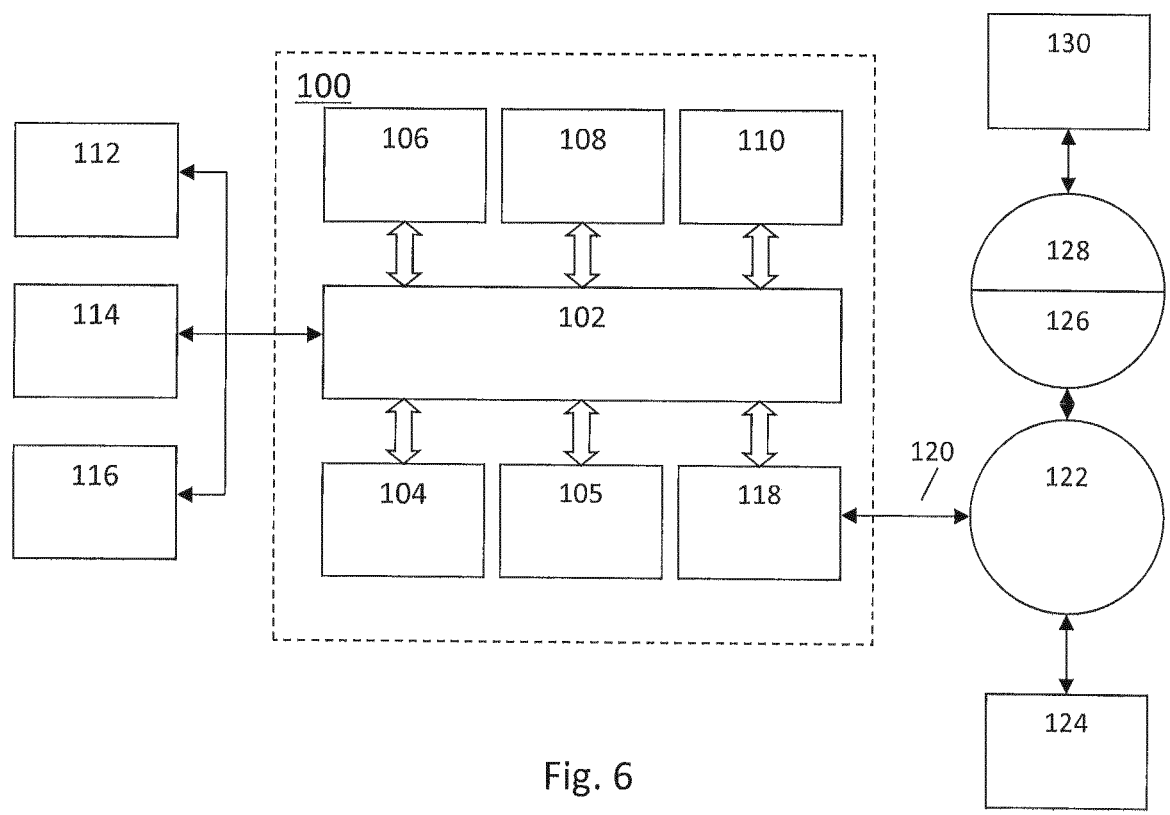
FIG. 6 is a block diagram of an example computer system.

FIG. 6 is a block diagram that illustrates a computer system 100 which can assist in implementing the methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 7:
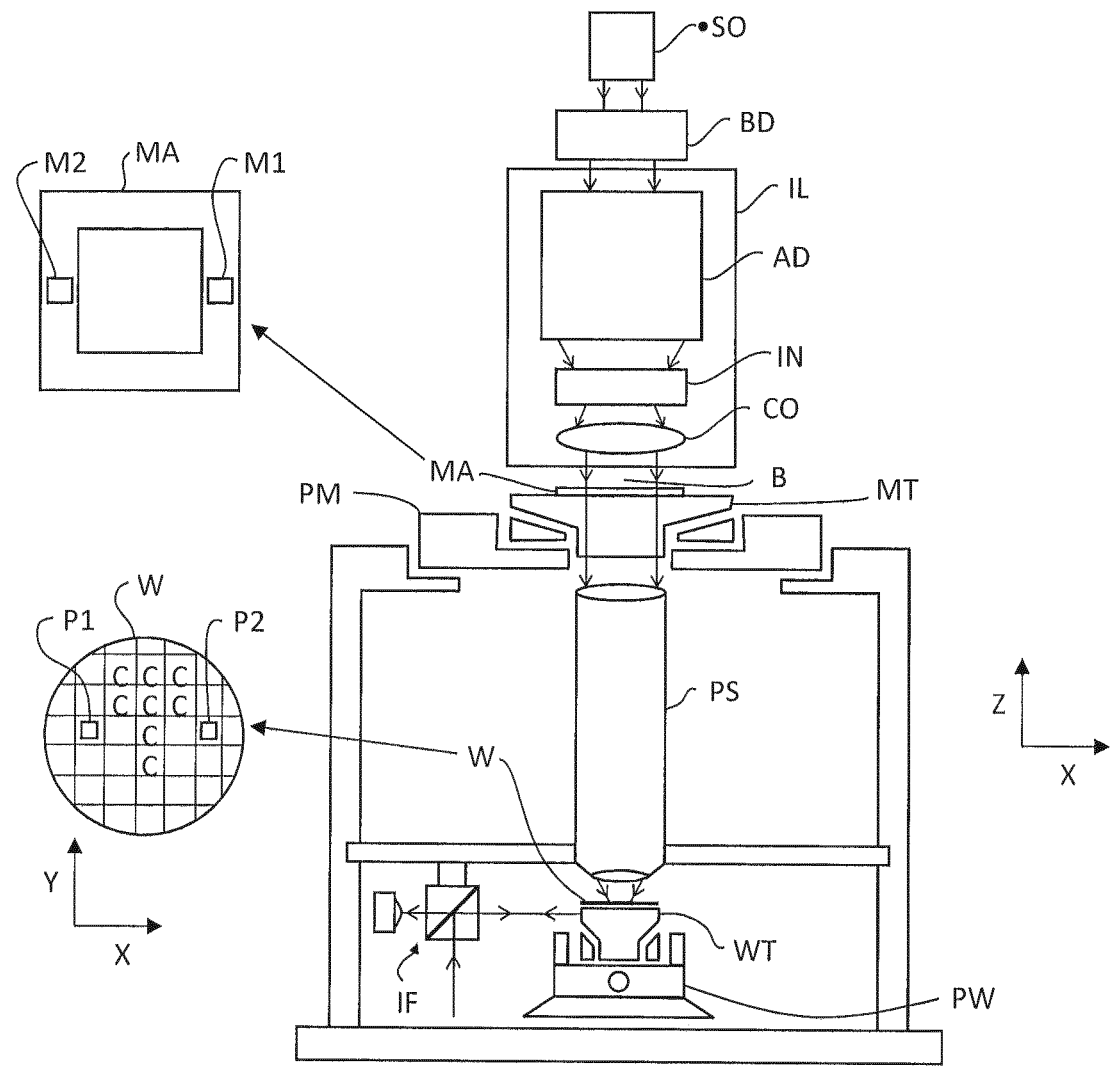
FIG. 7 is a schematic diagram of a lithographic projection apparatus.

FIG. 7 schematically depicts an exemplary lithographic projection apparatus whose illumination source could be optimized utilizing the methods described herein. The apparatus comprises:

an illumination system IL, to condition a beam B of radiation. In this particular case, the illumination system also comprises a radiation source SO;

a first object table (e.g., mask table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 7 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or F2 lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 7. However, in the case of a wafer stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=1/4 or 1/5). In this manner, a relatively large target portion C can be exposed, without having to compromise on resolution.

Figure 8:
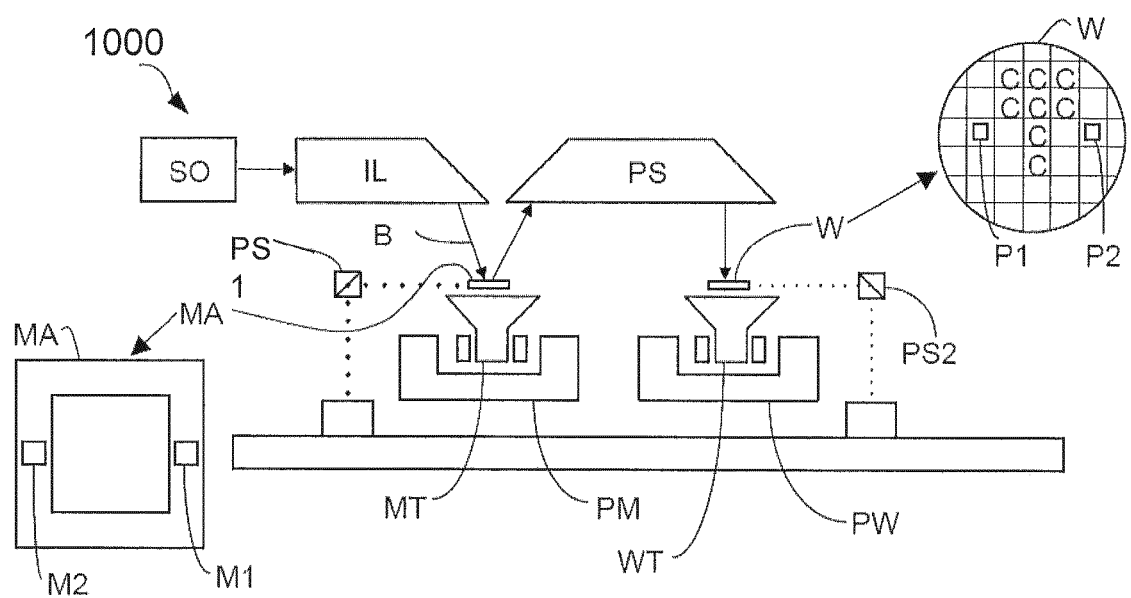
FIG. 8 is a schematic diagram of another lithographic projection apparatus.

FIG. 8 schematically depicts another exemplary lithographic projection apparatus 1000 whose illumination source could be optimized utilizing the methods described herein.

The lithographic projection apparatus 1000 includes:
a source collector module SO
an illumination system (illuminator) IL configured to condition a radiation beam B (e.g. EUV radiation);
a support structure (e.g. a mask table) MT constructed to support a patterning device (e.g. a mask or a reticle) MA and connected to a first positioner PM configured to accurately position the patterning device;
a substrate table (e.g. a wafer table) WT constructed to hold a substrate (e.g. a resist coated wafer) W and connected to a second positioner PW configured to accurately position the substrate; and
a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 8, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 8, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 9:
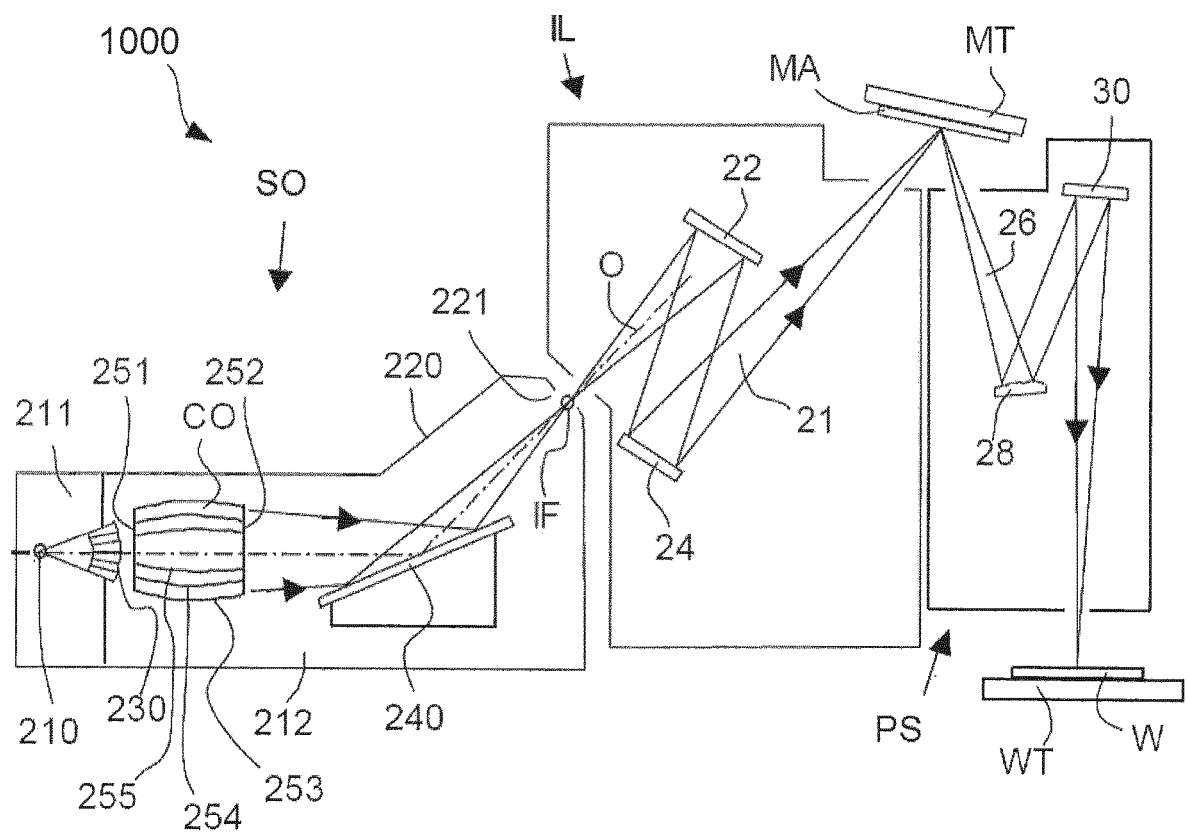
FIG. 9 is a more detailed view of the apparatus in FIG. 8.

FIG. 9 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 9.

Collector optic CO, as illustrated in FIG. 9, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 10:
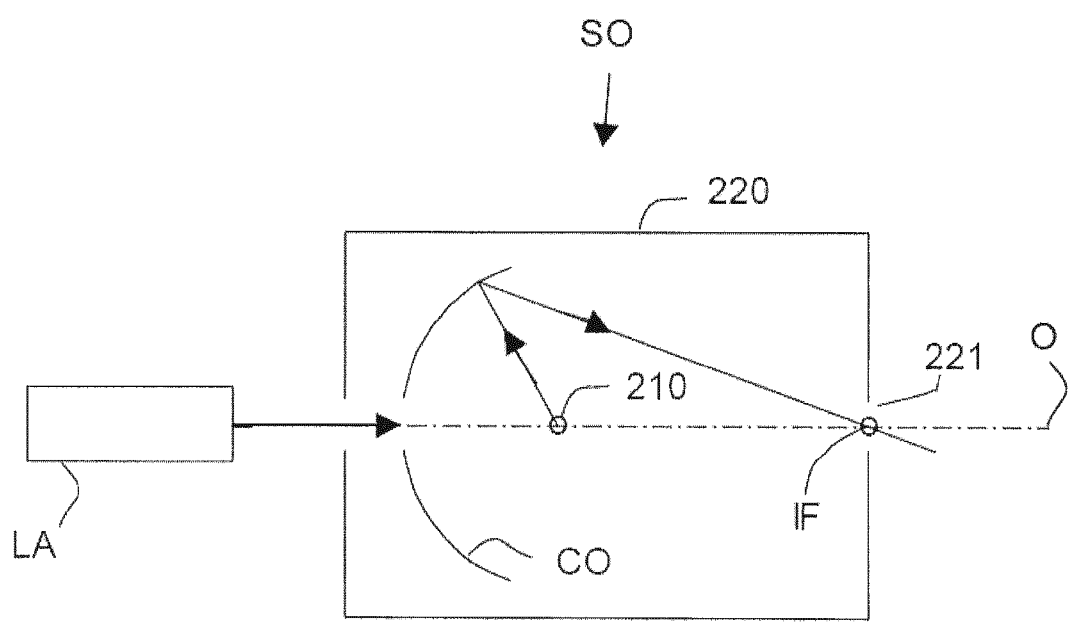
FIG. 10 is a more detailed view of the source collector module SO of the apparatus of FIG. 8 and FIG. 9.

Alternatively, the source collector module SO may be part of an LPP radiation system as shown in FIG. 10. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

The invention may further be described using the following clauses:

1. A computer-implemented method of defect validation for a device manufacturing process, the method comprising:
   obtaining a first image of a pattern processed into an area on a substrate using the device manufacturing process under a first condition;
   obtaining a metrology image from the area;
   aligning the metrology image and the first image; and
   determining from the first image and the metrology image whether the area contains a defect, based on one or more classification criteria.
2. The method of clause 1, wherein the area is one that may contain a defect.
3. The method of any one of clauses 1 to 2, further comprising, if the area contains a defect, reworking or discarding the substrate.
4. The method of any one of clauses 1 to 3, further comprising obtaining a second image of the pattern processed into the area using the device manufacturing process under a second condition, and determining the one or more classification criteria at least from the first and second images.
5. The method of clause 4, wherein the first and second images are selected from a group of resist image, image formed by etching, image formed by deposition and a combination thereof.
6. The method of any one of clauses 4 to 5, wherein the first image or the second image contains one or more contours.
7. The method of any one of clauses 4 to 6, wherein the pattern processed under the first condition is not a defect and the pattern processed under the second condition is a defect.
8. The method of any one of clauses 4 to 7, wherein at least one of the first image and the second image is simulated.
9. The method of any one of clauses 1 to 8, wherein the one or more classification criteria comprise whether a difference between two images is greater than a difference between the first image and the second image.
10. The method of any one of clauses 1 to 9, wherein the one or more classification criteria comprise whether a classifier classifies two images into different categories.
11. The method of any one of clauses 1 to 10, wherein obtaining the metrology image comprises obtaining the metrology image by a scanning electron microscope or an optical imaging tool.
12. The method of any one of clauses 1 to 11, wherein aligning the metrology image and the first image comprises matching a contour in the metrology image and a contour in the first image.
13. The method of any one of clauses 1 to 12, wherein obtaining the first image or the second image comprises using one or more models selected from a group consisting of a source model, a projection optics model, a design layout model, a resist model, an etching model, a deposition model and a combination thereof.
14. The method of any one of clauses 1 to 13, wherein identifying the area that may contain a defect comprises:
   determining a condition under which a pattern is or will be processed into the area;
   obtaining a process window of the pattern;
   if the condition falls outside the process window, the area is identified as an area that may have a defect.
15. The method of any one of clauses 1 to 14, wherein identifying the area that may contain a defect comprises:
   simulating an image of a pattern processed or will be processed into the area;
   measuring one or more parameters of the image;
   identifying whether the area may have a defect based on the one or more parameters.
16. The method of any one of clauses 1 to 15, wherein the one or more classification criteria comprise whether a difference between contours in two images is greater than a difference between contours in the first image and the second image.
17. The method of any one of clauses 1 to 16, wherein the device manufacturing process involves using a lithography apparatus.
18. The method of any one of clauses 1 to 17, further comprising, if the area contains a defect, verifying the defect.
19. The method of clause 18, further comprising, if the defect is not verified, adjusting identification of areas that may contain a defect.
20. A computer-implemented method of defect validation for a device manufacturing process, the method comprising:
   obtaining a first image of a pattern processed using a device manufacturing process under a first condition;
   obtaining a second image of the pattern processed using the device manufacturing process under a second condition, different from the first condition;
   determine one or more classification criteria at least from the first image and the second image;
   obtaining a metrology image from an area on a substrate, the metrology image containing the pattern;
   determining from the first image and the metrology image whether the area contains a defect, based on the one or more classification criteria.
21. The method of clause 20, wherein the first image is a previously obtained metrology image.
22. The method of clause 20, wherein the second image is a previously obtained metrology image.
23. The method of clause 20, wherein the first and second images are from different locations on the substrate.
24. A computer program product comprising a computer readable medium having instructions recorded thereon, the instructions when executed by a computer implementing the method of any of clauses 1 to 23.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

The invention claimed is:
1. A method of defect validation for a device manufacturing process, the method comprising:

obtaining a first image of a pattern as processed, or expected to be processed, into an area on a substrate using the device manufacturing process under a first condition;

obtaining a metrology image from the area;

aligning the metrology image and the first image; and determining, by a hardware computer system and based on one or more classification criteria, from the first image and the metrology image whether the area on the substrate contains a defect, wherein:

the one or more classification criteria are evaluated by the hardware computer system to determine whether the area contains a defect, and the one or more classification criteria are computer determined from evaluation of a simulation of the processing of the pattern using the device manufacturing process under a first processing condition with a simulation of the processing of the pattern using the device manufacturing process under a second different processing condition.

2. The method of claim 1, further comprising, responsive to the area containing a defect, reworking or discarding the substrate.

3. The method of claim 1, further comprising obtaining a second image of the pattern as processed, or expected to be processed, into the area using the device manufacturing process under a second condition, and determining the one or more classification criteria at least from the first and second images.

4. The method of claim 3, wherein the first and second images are one or more selected from a resist image, an after-etch image, and/or an after-deposition image.

5. The method of claim 3, wherein the first image or the second image contains one or more contours.

6. The method of claim 3, wherein the pattern processed under the first condition is not a defect and the pattern processed under the second condition is a defect.

7. The method of claim 3, wherein the first image and/or the second image is simulated.

8. The method of claim 1, wherein obtaining the metrology image comprises obtaining the metrology image by a scanning electron microscope or an optical imaging tool.

9. The method of claim 1, wherein aligning the metrology image and the first image comprises matching a contour in the metrology image and a contour in the first image.

10. The method of claim 1, further comprising identifying the area, the identifying comprising:

determining a processing condition under which a pattern is or will be processed into a region on the substrate;

obtaining a process window of the pattern; and responsive to the processing condition falling outside the process window, the region is identified as the area.

11. The method of claim 1, further comprising identifying the area, the identifying comprising:

simulating an image of a pattern processed, or that will be processed, into a region on the substrate;

measuring one or more parameters of the image; and identifying the area based on the one or more parameters.

12. The method of claim 1, wherein the one or more classification criteria comprise whether a difference between two images is greater than a difference between one image of the pattern processed into the area using the device manufacturing process under the first condition and another image of the pattern processed into the area using the device manufacturing process under a second condition, or wherein the one or more classification criteria comprise whether a difference between contours in two images is greater than a difference between contours in one image of the pattern processed into the area using the device manufacturing process under the first condition and another image of the pattern processed into the area using the device manufacturing process under a second condition, or wherein the one or more classification criteria comprise whether a classifier classifies two images into different categories.

13. The method of claim 1, further comprising, responsive to the area containing a defect, verifying the defect.

14. A method of defect validation for a device manufacturing process, the method comprising:

obtaining a first image of a pattern as processed, or expected to be processed, using a device manufacturing process under a first condition;

obtaining a second image of the pattern as processed, or expected to be processed, using the device manufacturing process under a second condition, different from the first condition;

determining one or more classification criteria at least from an evaluation between the first image and the second image;

obtaining a metrology image from an area on a substrate, the metrology image containing the pattern; and determining, by a hardware computer system, from an image of the pattern as processed, or expected to be processed, using the device manufacturing process under the first or second condition and the metrology image whether the area contains a defect, based on the one or more classification criteria that are evaluated to determine whether the area contains a defect.

15. A computer program product comprising a non-transitory computer-readable medium having instructions recorded thereon, the instructions when executed configured to cause a computer system to at least:

obtain a first image of a pattern as processed, or expected to be processed, into an area on a substrate using a device manufacturing process under a first condition;

obtain a metrology image from the area;

align the metrology image and the first image; and determine, based on one or more classification criteria, from the first image and the metrology image whether the area on the substrate contains a defect, wherein:

the one or more classification criteria are evaluated by the computer system to determine whether the area contains a defect, and the one or more classification criteria are computer determined from evaluation of a simulation of the processing of the pattern using the device manufacturing process under a first processing condition with a simulation of the processing of the pattern using the device manufacturing process under a second different processing condition.

16. The computer program product of claim 15, wherein the instructions are further configured to cause the computer system to obtain a second image of the pattern as processed, or expected to be processed, into the area using the device manufacturing process under a second condition, and determine the one or more classification criteria at least from the first and second images.

17. The computer program product of claim 16, wherein the pattern processed under the first condition is not a defect and the pattern processed under the second condition is a defect.

18. The computer program product of claim 15, wherein the instructions are further configured to identify the area and to identify the area, the instructions are further configured to cause the computer system to:

determine a processing condition under which a pattern is or will be processed into a region on the substrate;

obtain a process window of the pattern; and responsive to the processing condition falling outside the process window, the region is identified as the area.

19. The computer program product of claim 15, wherein the instructions are further configured to identify the area and to identify the area, the instructions are further configured to cause the computer system to:

simulate an image of a pattern processed, or that will be processed, into a region on the substrate;

obtain measurements of one or more parameters of the image; and identify the area based on the one or more parameters.

20. The computer program product of claim 15, wherein the one or more classification criteria comprise whether a difference between two images is greater than a difference between one image of the pattern processed into the area using the device manufacturing process under the first condition and another image of the pattern processed into the area using the device manufacturing process under a second condition, or wherein the one or more classification criteria comprise whether a difference between contours in two images is greater than a difference between contours in one image of the pattern processed into the area using the device manufacturing process under the first condition and another image of the pattern processed into the area using the device manufacturing process under a second condition, or wherein the one or more classification criteria comprise whether a classifier classifies two images into different categories.

21. The computer program product of claim 15, wherein the first image and/or the second image is simulated.

22. The method of claim 14, wherein the first image and/or the second image is simulated.

23. A computer program product comprising a non-transitory computer-readable medium having instructions recorded thereon, the instructions when executed configured to cause a computer system to at least:

obtain a first image of a pattern processed using a device manufacturing process under a first condition;

obtain a second image of the pattern processed using the device manufacturing process under a second condition, different from the first condition;

determine one or more classification criteria at least from an evaluation between the first image and the second image;

obtain a metrology image from an area on a substrate, the metrology image containing the pattern; and determine from an image of the pattern as processed, or expected to be processed, using the device manufacturing process under the first or second condition and the metrology image whether the area contains a defect, based on the one or more classification criteria that are evaluated to determine whether the area contains a defect.

24. The computer program product of claim 23, wherein the first image and/or the second image is simulated.

* * * * *